(12) United States Patent
Yang et al.

(10) Patent No.: US 10,985,965 B2
(45) Date of Patent: Apr. 20, 2021

(54) SYSTEM AND METHOD FOR DIGITAL MEMORIZED PREDISTORTION FOR WIRELESS COMMUNICATION

(71) Applicant: Dali Wireless, Inc., Menlo Park, CA (US)

(72) Inventors: Dali Yang, Mountain View, CA (US); Jia Yang, Mountain View, CA (US)

(73) Assignee: DALI WIRELESS, INC., Menlo Park, CA (US)

( * ) Notice: Subject to any disclaimer, the term of this patent is extended or adjusted under 35 U.S.C. 154(b) by 0 days.

(21) Appl. No.: 16/230,750

(22) Filed: Dec. 21, 2018

(65) Prior Publication Data

US 2019/0288900 A1    Sep. 19, 2019

Related U.S. Application Data

(63) Continuation of application No. 15/173,887, filed on Jun. 6, 2016, now abandoned, which is a continuation
(Continued)

(51) Int. Cl.
*H04L 27/36* (2006.01)
*H04L 1/00* (2006.01)
(Continued)

(52) U.S. Cl.
CPC ......... *H04L 27/368* (2013.01); *H03F 1/3247* (2013.01); *H03F 3/189* (2013.01);
(Continued)

(58) Field of Classification Search
CPC ........ H03F 1/32; H03F 1/3241; H03F 1/3242; H03F 1/3294; H03F 3/189; H03F 3/19;
(Continued)

(56) References Cited

U.S. PATENT DOCUMENTS 4,638,248 A    1/1987  Schweickert
4,700,151 A    10/1987 Nagata
(Continued)

FOREIGN PATENT DOCUMENTS

WO    2008105775 A1    9/2008

OTHER PUBLICATIONS

Bernardini et al., "Analysis of Different Optimization Criteria for IF Predistortion in Digital Radio Links With Nonlinear Amplifiers", IEEE Trans. on Communications, vol. 45, No. 4, Apr. 1997, pp. 421-428.
(Continued)

*Primary Examiner* — Young T. Tse
(74) *Attorney, Agent, or Firm* — Artegis Law Group, LLP

(57) ABSTRACT

A power amplifier system includes an input operable to receive an original value that reflects information to be communicated and an address data former operable to generate a digital lookup table key. The power amplifier system also includes a predistortion lookup table coupled to the address data former and a power amplifier having an output and coupled to the predistortion lookup table. The power amplifier system further includes a feedback loop providing a signal associated with the output of the power amplifier to the predistortion lookup table and a switch disposed in the feedback loop and operable to disconnect the predistortion lookup table from the output of the power amplifier.

20 Claims, 4 Drawing Sheets

Related U.S. Application Data of application No. 14/684,678, filed on Apr. 13, 2015, now Pat. No. 9,374,196, which is a continuation of application No. 14/245,190, filed on Apr. 4, 2014, now Pat. No. 9,031,521, which is a continuation of application No. 13/619,538, filed on Sep. 14, 2012, now Pat. No. 8,731,495, which is a continuation of application No. 11/262,079, filed on Oct. 27, 2005, now Pat. No. 8,326,238, which is a continuation of application No. 10/137,556, filed on May 1, 2002, now Pat. No. 6,985,704.

(51) Int. Cl.

| | |
|---|---|
| *H03F 3/189* | (2006.01) |
| *H03F 3/24* | (2006.01) |
| *H04W 52/52* | (2009.01) |
| *H03F 3/20* | (2006.01) |
| *H03F 1/32* | (2006.01) |
| *H04B 1/04* | (2006.01) |
| *H03F 3/195* | (2006.01) |
| *H03F 3/19* | (2006.01) |

(52) U.S. Cl.
CPC .............. *H03F 3/19* (2013.01); *H03F 3/195* (2013.01); *H03F 3/20* (2013.01); *H03F 3/24* (2013.01); *H03F 3/245* (2013.01); *H04B 1/0475* (2013.01); *H04L 1/0043* (2013.01); *H04L 1/0044* (2013.01); *H04L 27/367* (2013.01); *H04W 52/52* (2013.01); *H03F 2200/336* (2013.01); *H03F 2200/451* (2013.01); *H03F 2201/3224* (2013.01); *H03F 2201/3227* (2013.01); *H03F 2201/3233* (2013.01)

(58) Field of Classification Search
CPC ... H03F 3/195; H03F 3/20; H03F 3/24; H03F 3/245; H03F 2200/336; H03F 2200/451; H03F 2201/3224; H03F 2201/3227; H03F 2201/3233; H04B 1/0475; H04B 2001/0408; H04B 2001/0425; H04B 2001/0433; H04L 1/0043; H04L 1/0044; H04L 27/36; H04L 27/367; H04L 27/368; H04W 52/52
USPC ................ 375/296, 297, 300, 308; 330/149; 381/94.1, 94.7; 455/114.3
See application file for complete search history.

(56) References Cited

U.S. PATENT DOCUMENTS

| | | |
|---|---|---|
| 4,890,300 A | 12/1989 | Andrews |
| 4,929,906 A | 5/1990 | Voyce et al. |
| 5,049,832 A | 9/1991 | Cavers |
| 5,105,445 A | 4/1992 | Karam et al. |
| 5,107,520 A | 4/1992 | Karam et al. |
| 5,121,412 A | 6/1992 | Borth |
| 5,132,639 A | 7/1992 | Blauvelt et al. |
| 5,396,190 A | 3/1995 | Murata |
| 5,404,378 A * | 4/1995 | Kimura .................. H03C 3/08 327/317 |
| 5,486,789 A | 1/1996 | Palandech et al. |
| 5,524,286 A | 6/1996 | Chiesa et al. |
| 5,579,342 A | 11/1996 | Crozier |
| 5,589,797 A | 12/1996 | Gans et al. |
| 5,655,220 A | 8/1997 | Weiland et al. |
| 5,675,287 A | 10/1997 | Baker et al. |
| 5,678,198 A | 10/1997 | Lemson |
| 5,699,383 A | 12/1997 | Ichiyoshi |
| 5,732,333 A | 3/1998 | Cox et al. |
| 5,740,520 A | 4/1998 | Cyze et al. |
| 5,757,229 A | 5/1998 | Mitzlaff |
| 5,786,728 A | 7/1998 | Alinikula |
| 5,870,668 A | 2/1999 | Takano et al. |
| 5,920,808 A | 7/1999 | Jones et al. |
| 5,923,712 A | 7/1999 | Leyendecker et al. |
| 5,936,464 A | 8/1999 | Grondahl |
| 5,937,011 A | 8/1999 | Carney et al. |
| 5,949,283 A | 9/1999 | Proctor et al. |
| 5,959,499 A | 9/1999 | Khan et al. |
| 5,959,500 A | 9/1999 | Garrido et al. |
| 5,963,549 A | 10/1999 | Perkins et al. |
| 6,054,896 A | 4/2000 | Wright et al. |
| 6,055,418 A | 4/2000 | Harris et al. |
| 6,081,158 A | 6/2000 | Twitchell et al. |
| 6,091,941 A | 7/2000 | Moriyama et al. |
| 6,208,698 B1 | 3/2001 | Marchesani et al. |
| 6,236,267 B1 | 5/2001 | Anzil et al. |
| 6,240,144 B1 | 5/2001 | Ha |
| 6,242,979 B1 | 6/2001 | Li |
| 6,246,286 B1 | 6/2001 | Persson |
| 6,246,865 B1 | 6/2001 | Lee |
| 6,252,912 B1 | 6/2001 | Salinger et al. |
| 6,275,685 B1 | 8/2001 | Wessel et al. |
| 6,301,579 B1 | 10/2001 | Becker |
| 6,313,703 B1 | 11/2001 | Wright et al. |
| 6,314,142 B1 | 11/2001 | Perthold et al. |
| 6,320,463 B1 | 11/2001 | Leva et al. |
| 6,356,555 B1 | 3/2002 | Rakib et al. |
| 6,373,902 B1 | 4/2002 | Park et al. |
| 6,388,518 B1 | 5/2002 | Miyatani et al. |
| 6,400,774 B1 | 6/2002 | Matsuoka et al. |
| 6,424,225 B1 | 7/2002 | Choi et al. |
| 6,489,846 B2 | 12/2002 | Hatsugai |
| 6,512,417 B2 | 1/2003 | Booth et al. |
| 6,552,634 B1 | 4/2003 | Raab |
| 6,587,514 B1 | 7/2003 | Wright et al. |
| 6,591,090 B1 | 7/2003 | Vuorio et al. |
| 6,600,792 B2 | 7/2003 | Antonio et al. |
| 6,614,854 B1 | 9/2003 | Chow et al. |
| 6,625,429 B1 | 9/2003 | Yamashita |
| 6,639,050 B1 | 10/2003 | Kieliszewski |
| 6,639,950 B1 | 10/2003 | Lagerblom et al. |
| 6,677,870 B2 | 1/2004 | Im et al. |
| 6,697,436 B1 | 2/2004 | Wright et al. |
| 6,703,897 B2 | 3/2004 | O'Flaherty et al. |
| 6,741,662 B1 * | 5/2004 | Francos ................ H03F 1/3247 375/296 |
| 6,741,663 B1 | 5/2004 | Tapio et al. |
| 6,741,867 B1 | 5/2004 | Tetsuya |
| 6,747,649 B1 | 6/2004 | Sanz-Pastor et al. |
| 6,751,447 B1 | 6/2004 | Jin et al. |
| 6,885,241 B2 | 4/2005 | Huang et al. |
| 6,898,252 B1 | 5/2005 | Yellin et al. |
| 6,907,085 B2 | 6/2005 | Kubo et al. |
| 6,963,242 B2 | 11/2005 | White et al. |
| 6,973,139 B2 | 12/2005 | Ahn et al. |
| 6,983,025 B2 | 1/2006 | Schell |
| 6,985,704 B2 | 1/2006 | Yang et al. |
| 6,998,909 B1 | 2/2006 | Mauer |
| 7,023,273 B2 | 4/2006 | Johnson et al. |
| 7,035,345 B2 | 4/2006 | Jeckeln et al. |
| 7,042,287 B2 | 5/2006 | Robinson |
| 7,061,314 B2 | 6/2006 | Kwon et al. |
| 7,064,606 B2 | 6/2006 | Louis |
| 7,071,777 B2 | 7/2006 | McBeath et al. |
| 7,079,818 B2 | 7/2006 | Khorram |
| 7,098,734 B2 | 8/2006 | Hongo et al. |
| 7,102,442 B2 | 9/2006 | Anderson |
| 7,103,329 B1 | 9/2006 | Thon |
| 7,104,310 B2 | 9/2006 | Hunter |
| 7,106,806 B1 | 9/2006 | Kenington |
| 7,109,792 B2 | 9/2006 | Leffel |
| 7,109,998 B2 | 9/2006 | Smith |
| 7,123,890 B2 | 10/2006 | Kenington et al. |
| 7,151,913 B2 | 12/2006 | Ahmed |
| 7,158,765 B2 | 1/2007 | Blair et al. |
| 7,190,222 B2 | 3/2007 | Okazaki et al. |
| 7,193,472 B2 | 3/2007 | Gotou et al. |
| 7,248,642 B1 | 7/2007 | Vella-Coleiro |

(56) References Cited

U.S. PATENT DOCUMENTS

| | | | |
|---|---|---|---|
| 7,259,630 | B2 | 8/2007 | Bachman et al. |
| 7,321,635 | B2 | 1/2008 | Ocenasek et al. |
| 7,321,636 | B2 | 1/2008 | Harel et al. |
| 7,372,918 | B2 | 5/2008 | Muller et al. |
| 7,469,491 | B2 | 12/2008 | McCallister et al. |
| 7,813,221 | B2 | 10/2010 | Barakat et al. |
| 7,831,221 | B2 | 11/2010 | Leffel et al. |
| RE42,287 | E | 4/2011 | Apodaca et al. |
| 8,064,850 | B2 | 11/2011 | Yang et al. |
| 8,326,238 | B2 | 12/2012 | Yang et al. |
| 8,380,143 | B2 | 2/2013 | yang et al. |
| 8,472,897 | B1 | 6/2013 | Yang |
| 8,620,234 | B2 | 12/2013 | Yang et al. |
| 8,731,495 | B2 | 5/2014 | Yang et al. |
| 8,811,917 | B2 * | 8/2014 | Kim .................. H03F 1/3258 455/114.3 |
| 9,031,521 | B2 | 5/2015 | Yang et al. |
| 9,054,758 | B2 | 6/2015 | Yang et al. |
| 9,077,297 | B2 | 7/2015 | Yang et al. |
| 9,374,196 | B2 | 6/2016 | Yang et al. |
| 9,742,446 | B2 | 8/2017 | Yang et al. |
| 10,097,142 | B2 | 10/2018 | Yang et al. |
| 10,305,521 | B2 | 5/2019 | Yang et al. |
| 2001/0005402 | A1 * | 6/2001 | Nagatani ............. H03F 1/3247 375/296 |
| 2001/0051504 | A1 | 12/2001 | Kubo et al. |
| 2002/0025790 | A1 | 2/2002 | Matsuoka et al. |
| 2002/0034260 | A1 | 3/2002 | Kim |
| 2002/0041208 | A1 | 4/2002 | Hamada et al. |
| 2002/0044014 | A1 | 4/2002 | Wright et al. |
| 2002/0080891 | A1 | 6/2002 | Ahn et al. |
| 2002/0101937 | A1 | 8/2002 | Antonio et al. |
| 2002/0101938 | A1 | 8/2002 | Horaguchi et al. |
| 2002/0186783 | A1 | 12/2002 | Opas et al. |
| 2002/0187761 | A1 | 12/2002 | Im et al. |
| 2002/0191710 | A1 | 12/2002 | Jeckeln et al. |
| 2002/0193085 | A1 | 12/2002 | Mathe et al. |
| 2002/0193087 | A1 | 12/2002 | Kim |
| 2003/0035494 | A1 | 2/2003 | Bauder et al. |
| 2003/0058959 | A1 | 3/2003 | Rafie et al. |
| 2003/0095608 | A1 | 5/2003 | Duperray |
| 2003/0098752 | A1 | 5/2003 | Haghighat |
| 2003/0112068 | A1 | 6/2003 | Kenington |
| 2003/0146787 | A1 | 8/2003 | Hedberg et al. |
| 2003/0179829 | A1 | 9/2003 | Pinckley et al. |
| 2003/0179830 | A1 | 9/2003 | Eidson et al. |
| 2003/0207680 | A1 | 11/2003 | Yang et al. |
| 2004/0017859 | A1 | 1/2004 | Sills et al. |
| 2004/0142667 | A1 | 7/2004 | Lochhead et al. |
| 2004/0180634 | A1 | 9/2004 | Kenington et al. |
| 2004/0203542 | A1 * | 10/2004 | Seo .................. H03F 1/3247 455/126 |
| 2004/0240585 | A1 | 12/2004 | Bishop et al. |
| 2005/0079834 | A1 | 4/2005 | Maniwa et al. |
| 2005/0159117 | A1 | 7/2005 | Bausov et al. |
| 2005/0226346 | A1 | 10/2005 | Ode et al. |
| 2005/0253652 | A1 | 11/2005 | Song et al. |
| 2005/0262498 | A1 | 11/2005 | Ferguson et al. |
| 2006/0012426 | A1 | 1/2006 | Nezami |
| 2006/0046665 | A1 | 3/2006 | Yang et al. |
| 2006/0067426 | A1 | 3/2006 | Maltsev et al. |
| 2006/0109052 | A1 | 5/2006 | Saed et al. |
| 2006/0121858 | A1 | 6/2006 | Tanaka et al. |
| 2006/0217083 | A1 | 9/2006 | Braithwaite |
| 2006/0226903 | A1 | 10/2006 | Muller et al. |
| 2006/0238245 | A1 | 10/2006 | Carichner et al. |
| 2006/0240786 | A1 | 10/2006 | Liu |
| 2006/0270366 | A1 | 11/2006 | Rozenblit et al. |
| 2007/0075780 | A1 | 4/2007 | Krvavac et al. |
| 2007/0171234 | A1 | 7/2007 | Crawfis et al. |
| 2007/0190952 | A1 | 8/2007 | Waheed et al. |
| 2007/0241812 | A1 | 10/2007 | Yang et al. |
| 2007/0273439 | A1 | 11/2007 | Lin et al. |
| 2013/0147550 | A1 | 6/2013 | Yang et al. |
| 2013/0243124 | A1 | 9/2013 | Yang et al. |
| 2014/0306762 | A1 | 10/2014 | Yang et al. |
| 2015/0326349 | A1 | 11/2015 | Yang et al. |
| 2015/0333710 | A1 | 11/2015 | Yang et al. |
| 2016/0036394 | A1 | 2/2016 | Yang et al. |
| 2017/0033969 | A1 | 2/2017 | Yang et al. |
| 2018/0097530 | A1 | 4/2018 | Yang et al. |

OTHER PUBLICATIONS

Cavers, "Adaptive Behavior of a Feed-Forward Amplifier Linearizer", IEEE Trans. on Vehicular Technology, vol. 44, No. 1, Feb. 1995, pp. 31-40.

Cavers, "Amplifier Linearization Using Digital Predistorter With Fast Adaptation and Low Memory Requirements", IEEE Trans. on Vehicular Technology, vol. 39, No. 4, Nov. 1990, pp. 374-382.

Eun et al., "A New Volterra Predistorter Based on the Indirect Learning Architecture", IEEE Transactions on Signal Processing, vol. 45, issue 1, Jan. 1997, pp. 223-227.

Faukner et al., "Adaptive Linearization Using Predistortion—Experimental Results", IEEE Trans. on Vehicular Technology, vol. 43, No. 2, May 1994, pp. 323-332.

Hilborn et al., "An Adaptive Direct Conversion Transmitter", IEEE Trans. on Vehicular Technology, vol. 43, No. 2, May 1994, pp. 223-233.

Nagata, "Linear Amplification Technique for Digital Mobile Communications", in Proc. 39th IEEE Vehicular Technology Conference, San Francisco, CA, 1989, pp. 159-165.

Santella, "Performance of Adaptive Predistorters in Presence of Orthogonal Multicarrier Modulation", International Conference on Telecommunications, Melbourne, Australia, Apr. 2-5, 1997, pp. 621-626.

* cited by examiner

SYSTEM AND METHOD FOR DIGITAL MEMORIZED PREDISTORTION FOR WIRELESS COMMUNICATION

CROSS REFERENCE TO RELATED APPLICATIONS

This application is a continuation of U.S. patent application Ser. No. 15/173,887, filed on Jun. 6, 2016, now abandoned, which is a continuation of U.S. patent application Ser. No. 14/684,678, filed on Apr. 13, 2015, now U.S. Pat. No. 9,374,196; which is a continuation of U.S. patent application Ser. No. 14/245,190, filed on Apr. 4, 2014, now U.S. Pat. No. 9,031,521; which is a continuation of U.S. patent application Ser. No. 13/619,538, filed on Sep. 14, 2012, now U.S. Pat. No. 8,731,495; which is a continuation of U.S. patent application Ser. No. 11/262,079, filed on Oct. 27, 2005, now U.S. Pat. No. 8,326,238; which is a continuation of U.S. patent application Ser. No. 10/137,556, filed on May 1, 2002, now U.S. Pat. No. 6,985,704, each of which are incorporated by reference in their entirety.

BACKGROUND OF THE INVENTION

The present invention relates to wireless communication. The present invention is especially applicable to mobile wireless communication and processing of signals to compensate for nonlinearities associated with power amplifiers used for wireless transmission.

Next-generation wireless communication will utilize improved transmitter technology for variety of broadband and multimedia services, supported by advanced potable equipment and handsets. For a long time, the longer handset battery life-time, better call quality and less wireless high-frequency radiation to human brain are three most concerning and insolvable issues for mobile phone designers and users. Actually, the above three problems are closely related to spectral efficiency and power efficiency of handset, because both higher spectral efficiency and power efficiency will greatly improve mobile system performance, extend handset battery life-time and reduce handset transmitted power to some extent. However, the nonlinear distortion and low DC conversion efficiency introduced by power amplifier (PA) in current handset RF transmitter impact severely performance of wireless system and shortens greatly battery life-time of handset.

Next-generation wireless communication will require improved transmitter technology for variety of broadband and multimedia applications, supported by advanced improved base stations and access points to potable equipment and handsets. The spectral efficiency and power efficiency are among the most important requirements of mobile communication systems. For many years, the designers of wireless communication system have been concerning the issue of PA linearization in RF transmitter, because it is closely related to the development of highly spectral efficiency modulation scheme. It has been demonstrated that the spectrally efficient linear modulation technologies such as QPSK and QAM have high spectral efficiency under the case of linear amplification. However, in order to obtain the highest power efficiency, the nonlinear power amplifier such as Class AB, C or D is required in final amplifying stage of RF transmitter. Unfortunately, the high power efficiency of nonlinear amplifiers generates nonlinear inter-modulation products in adjacent channels, which results in both amplitude to amplitude (AM-AM) and amplitude to phase (AM-PM) distortion. The nonlinear distortion will cause spectral broadening and high out-of-band power emission of output signal. As the result, the signal spectrum expands into adjacent channels to produce interference for other users. Furthermore, these inter-modulation distortion products are spaced so close to the desired signal and cannot simply be filtered out by conventional filters. In order to avoid the nonlinear distortion, a simple and usual solution is to back off output signal from the saturation range of PA so that signal level is confined to the power amplifier. However, this will result in a less power efficient operation because several decibels of back off are required usually to obtain appropriate linearity. Obviously, the approach is not suitable to the advanced wireless system design that should be a high capacity and efficient digital transmission system.

For a long time, the longer handset battery's life-time, less radio radiation to human brain and high voice quality have been the most concerning problems by handset designers, makers and users. Actually, the key to solve above problems is closely related to develop the handset RF system with spectral efficiency and power efficiency. The higher spectral efficiency and power efficiency not only improve greatly mobile system performance, but also extend battery life-time of handset and reduce transmitter's radiation which will be helpful to protect users' brain from radiation to some extent.

Current predistortion technologies used widely to linearize PA in mobile communication system are mainly analog predistorter implemented at IF/RF by means of analog circuit and digital predistorter at baseband with digital signal processing (DSP) technique.

The analog predistorter is based on the principle of error subtraction and power match to realize linearization of PA, and, hence must use an auxiliary PA to match the main PA. Under a perfect matching, the error of auxiliary PA will compensate nonlinear distortion caused by main PA. Because nonlinear feature of PA is very complicated and many variables are involved, the analog predistortion has only less predistortion accuracy and consumes more power.

In contrast, the DSP-based predistorter is usually preferred since it has stable characteristics that perform in a wide range of temperatures, and eliminates the necessary of tuning in factory. Therefore, it is better suitable to the fast tracking and adjusting any possible changes in PA parameters, such as drifts due to temperature, aging and operating point variations.

Unfortunately, although DSP-based predistortion technologies have advantages over analog ones, it is difficult for current digital predistortion schemes to apply to handset and wideband system because of complexity in hardware organization 25 and DSP algorithm.

SUMMARY OF THE INVENTION

In order to avoid interference and enhance performance of handset, RF power amplifier of handset should have a near-linear conversion characteristic. The linearization characteristics can be obtained, for example, by systems and methods for predistortion according to embodiments of the present invention.

According to one embodiment of the present invention, there is a system for signal processing in preparation for wireless transmission, the wireless transmission being from a portable wireless communication device, wherein the wireless transmission includes use of a power amplifier having nonlinear characteristics. The system comprises: memory for storing digitally-indexed information, wherein the digitally-indexed information models nonlinear characteristics of the power amplifier, and the digitally-indexed information is stored prior to processing of a first signal that reflects information to be communicated; first logic, configured to accept the first signal and to retrieve, based on the first signal, a portion of the digitally-indexed information stored in the memory; second logic, configured to generate a second signal based on the portion of the digitally-accessed information and on the first signal, wherein the second signal pre-compensates for the nonlinear characteristics of the power amplifier, and the second signal is for wireless transmission based on the second signal.

According to another embodiment of the present invention, there is a portable electronic device having wireless communication capabilities. The portable electronic device comprises: a processor for executing commands that direct operations of the portable electronic device; a wireless transmission stage that includes a power amplifier having nonlinear characteristics; memory for storing digitally-indexed data, including digitally-indexed information that reflects nonlinear characteristics of the power amplifier; and code stored in the memory that directs the processor to: determine, given a first signal that includes information to be communicated wirelessly, a correction contribution based on the signal and on the digitally-indexed information that reflects nonlinear characteristics of the power amplifier; and pre-compensate for the nonlinear characteristics of the power amplifier, based on the correction contribution, to obtain a second signal, wherein the wireless transmission stage will transmit wirelessly based on the second signal.

According to another embodiment of the present invention, there is, in a portable mobile device, a method for processing signals in preparation for wireless transmission, wherein the wireless transmission includes use of a power amplifier. The method comprises: maintaining a lookup table that contains pre-computed distortion contributions, the distortion contributions being for distorting of signals to thereby pre-compensate the signals for nonlinear characteristics of the power amplifier; accepting a value that reflects information to be communicated, the value hereinafter referred to as original value; generating a lookup-table key based on the original value, wherein the lookup-table key is digital; retrieving from the lookup table, using the lookup-table key, a pre-computed distortion contribution for the original value; distorting the original value based on the pre-computed distortion contribution to obtain a distorted value to pre-compensate for the nonlinear characteristics of the power amplifier; and wirelessly transmitting based on the distorted value.

These and other embodiments of the present invention are further made apparent, in the remainder of the present document, to those of ordinary skill in the art.

BRIEF DESCRIPTION OF THE DRAWINGS

In order to more fully describe embodiments of the present invention, reference is made to the accompanying drawings. These drawings are not to be considered limitations in the scope of the invention, but are merely illustrative.

DETAILED DESCRIPTION OF SPECIFIC EMBODIMENTS

Figure 1:
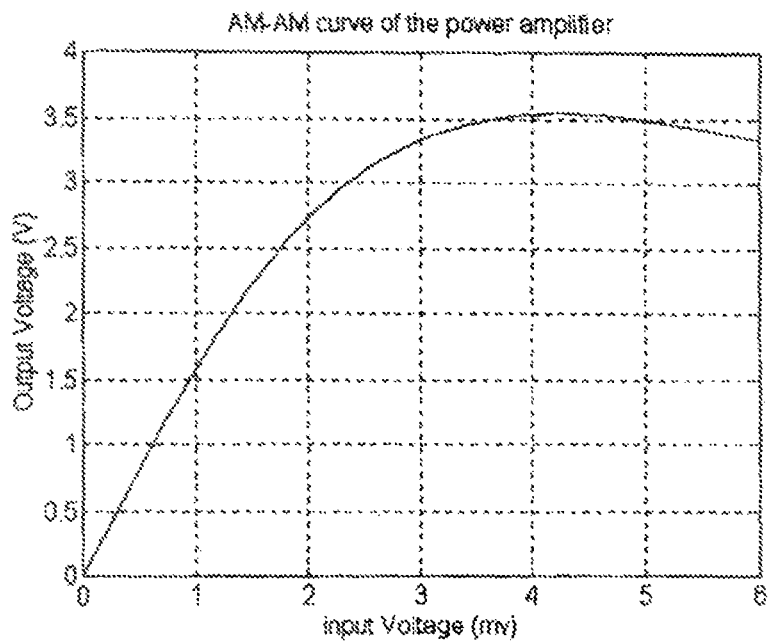
FIGS. 1 and 2 show typical AM-AM and AM-PM behaviors of PA to be predistorted.

The description above and below and the drawings of the present document focus on one or more currently preferred embodiments of the present invention and also describe some exemplary optional features and/or alternative embodiments. The description and drawings are for the purpose of illustration and not limitation. Those of ordinary skill in the art would recognize variations, modifications, and alternatives. Such variations, modifications, and alternatives are also within the scope of the present invention. Section titles are terse and are for convenience only.

Preferred embodiments of the present invention relate to a novel digital adaptive predistorter to linearize power amplifier (PA) in RF transmitter of mobile stations, including variety of mobile potable equipment, handsets and PDA, for CDMA, TDMA, 20 GSM, GPRS, 3G (UMTS, W-CDMA, CDMA2000, 3GPP and others), WLAN system that transmits the complex modulated signal with aid of quadrature modulator and power amplifier. Because power amplifier in RF transmitter distorts RF output signal, the digital predistorter is used to correct non-linearity of PA by predistortion in opposite sense to PA input. The preferred circuit arrangement in embodiments of the present invention is specially designed for all wireless mobile stations or handsets, and also can be used in base stations or access points and other wireless communication systems such as microwave and satellite communications. Preferred embodiments of the present invention present a practicable DSP-based predistortion algorithm and organization using to handset without increasing manufacture cost but improving greatly handset performance.

In accordance with the preferred embodiment architecture, a presented digital adaptive predistorter is designed to linearize wireless RF transmitter for all handsets system, such as for CDMA, TDMA, GSM, 3G and WLAN system, and the like. For the application of predistortion technology in handset, the following issues are especially of interest:
1. Dynamic predistortion control range to track and correct non-linearity of PA in wider range;
2. Fast convergence speed to swiftly track characteristics of PA;
3. Requirement for low power consumption to extend handset battery life-time, which needs time-saving software algorithm and less complicity hardware structure;
4. Being able to use the existing source and chip room in handset for manufacture cost consideration.

Based on above considerations, a new design of adaptive memorized predistorter 15 for wireless handsets, according to an embodiment of the present invention has the following properties:
1. Using a stored compensation principle's structure to make the predistorter be able to memory great amount nonlinear characteristics of PA for much better predistortion performance in wider dynamic range;
2. Using a time-delay adaptive structure to improve non-linearity tracking;
3. Using a simple architecture in implementation to use the existing DSP room in handsets without additional hardware circuit for low power consumption and low manufacture cost. 25

Figure 3:
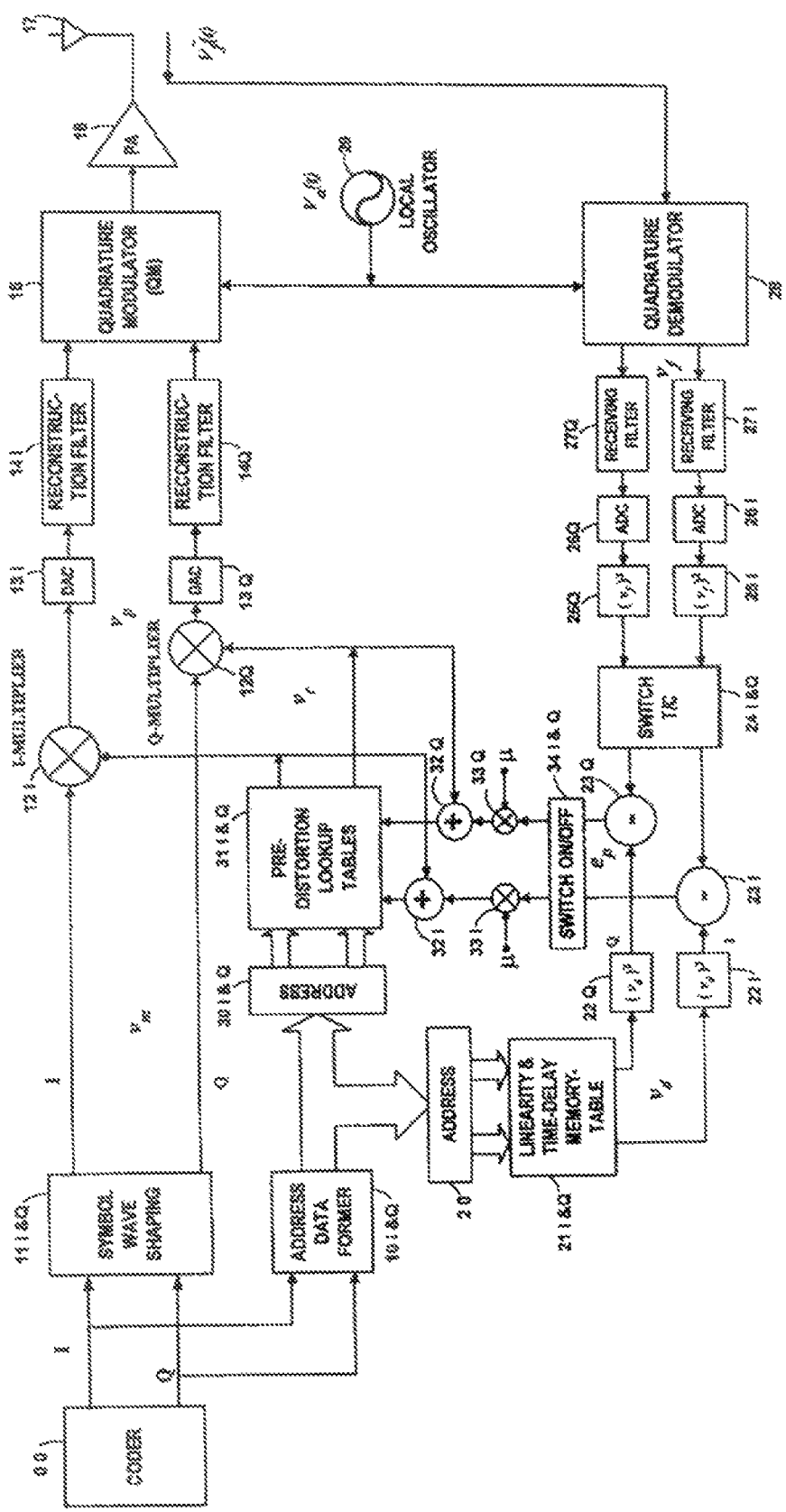
FIG. 3 shows a training schematic diagram of digital adaptive predistorter to linearize power amplifier in handset, which is an embodiment of the present invention.

The components of embodiment architecture shown in FIG. 3 are described as follows:

00: Coder to generate the required modulation data under wireless system specifications
10 I-Q: Address data formers to obtain the required address data
11 I-Q: Base band symbol wave shaping filters
12 I-Q: N-bit vector multipliers to result the predistorted signals for I-Q channel respectively
13 I-Q: Digit to analog converters
14 I-Q: Analog reconstruction filters
15: Quadrature modulator
16: Nonlinear power amplifier
17: Antenna
20 I-Q: Address registers
21 I-Q: Memory tables to store linearity of PA and time-delay characteristics of channels
22 I-Q: Square circuits to generate the envelope of reference signals $v_d$
23 I-Q: Envelope comparator to generate the error signals $e_p$
24 I-Q: Switch T/C: T is in the training status when system is trained and C is in the calling status when system finishes training
25 I-Q: Square circuits of feedback channels to generate the envelope of feedback signals $v_f$
26 I-Q: Analog to digit converters
27 I-Q: Analog receiving filters
28: Demodulator
29 Local oscillator to generate a high frequency carrier signal
30 I-Q: Address registers of lookup tables
31 I-Q: Predistortion lookup tables to store nonlinear characteristic of PA
32 I-Q: Adders of lookup tables
33 I-Q: Step size factors of adaptive algorithm
34 I-Q: Switch On/Off: On is when system is trained, and Off is when the training finished Power Amplifier (PA) Model Prior to further describing the predistorter according to embodiments the present patent, the characteristic of PA is discussed initially.

Power amplifier is the final stage of handset RF transmitter, and normally consumes the most electrical power. For the high efficient linear modulations such as QPSK or QAM, a linear high power amplifier must be used to maintain optimum spectral efficiency and low out-of-band emission. Such a linear amplifier, however, does not usually have a good DC to RF power conversion efficiency. For instance, traditional class-A power amplifier has a maximum theoretical power conversion efficiency of 50%. This is a major drawback for mobile application, especially for the portable battery operated equipment such as handsets, where battery life is of major importance. The power conversion efficiency can be obtained by using nonlinear power amplifier, such as class AB, C or D power amplifier. However, these amplifiers distort the input-output signal and cause spectral broadening and high out-of-band power emission of the output signal.

Figure 2:
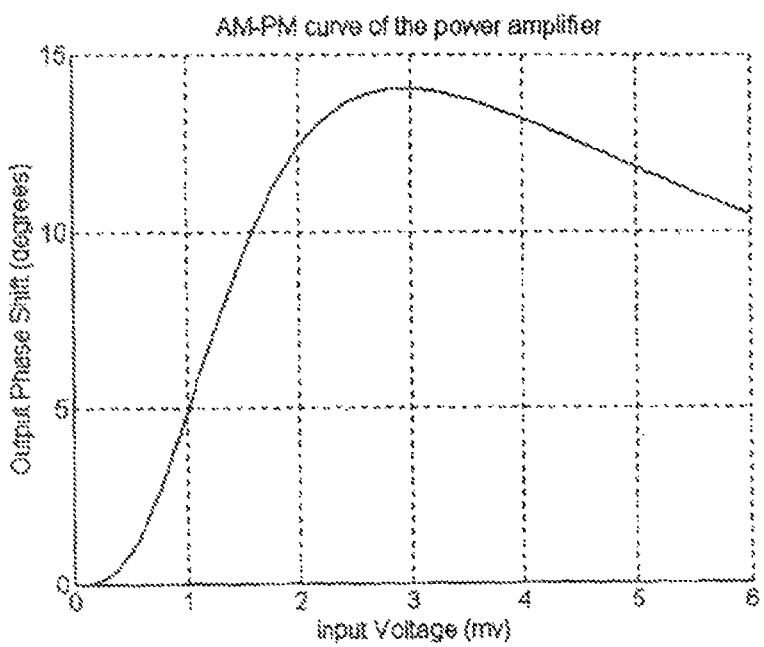

The PA in mobile communication system should typically be operated close to saturation or even saturated so as to maximize power efficiency. The saturation has serious repercussions on the signal to be amplified, and exhibits nonlinear characteristics such as amplitude and phase distortion that lead to an undesirable inter-modulation interference in the neighboring frequency band. The amplitude and phase characteristics used in this patent are shown in FIGS. 1 and 2, respectively.

Adaptive Predistorter

FIG. 3 shows the organization of handset digital predistorter from base band through RF part. The predistorter consists of address data formers 10I-10Q, linearity and time-delay lookup tables 21I-21Q, predistortion lookup tables 31I-31Q, vector multipliers 12I-12Q, error comparators 23I-23Q, and two types of switches 24I-24Q and 34I-34Q. All signals in the architecture are denoted by v(t) with the corresponding subscripts to express their location in system.

In accordance with a preferred implementation of the presented invention, the coded I/Q data symbols to be transmitted are fed into both digital base band waveshaping filters 11I-11Q and address data former 10I-10Q, respectively.

The address data formers 10I-10Q are designed to generate the required binary signal format. The data formers 10I-10Q receive signal from coder 00 first, and then transform the received signal to the sign symbol with form either 0 or 1. The binary data are used as the address of both predistortion lookup tables 31I-31Q and linearity and time-delay lookup tables 21I-21Q.

The linearity and time-delay tables 31I-31Q are used to store the linearity characteristics of PA 16 and time-delay parameters of channels. The signal time-delay of channel is caused when I- and Q-signal from the output of shaping filters 11I-11Q pass through the circuit components, such as multiplier 12I-12Q, DAC 13I-13Q, reconstruction filters 14I-14Q, QM 15, PA 16, DQM 28, receiver filters 27I-27Q, ADCs 26I-26Q, squire circuits 25I-25Q and switchers 24I-24Q to the comparers 23I-23Q. The 20 stored signals in the tables 21I-21Q are first obtained by adaptive iteration, and then are used as linear reference model to compare feedback signal that contains nonlinear distortion component. The lookup tables 21I-21Q are updated by adaptive algorithm in training period. When the training period is over, the required linear and time-delay information are stored in the tables for predistortion tables' training. As the result, there is no necessary to build a special time-delay circuit for channel time-delay estimate of handset.

The predistorter lookup tables 30I-30Q are used to store the predistortion signal to linearize power amplifier. The required predistorted signals in the tables are obtained by adaptive training and by comparing the outputs of tables 21I-21Q and feedback signals. The outputs $v_r(k)$ of lookup table 30I-30Q are fed to multipliers 12I-12Q, and multiply with signals $v_m(k)$ from shaping filters 11I-11Q to result a predistorted signal $v_p(k)$ that is an inverse non-linearity of PA to predistort the input of PA.

The switch ON/OFF controllers 34I-34Q are set to ON status when predistortion lookup tables 31I-31Q are trained by adaptive algorithm. After the training procedure completed, the switches are set to Off status and the predistortion lookup tables 34I-34Q are no longer updated adaptively.

The switch T/C controllers 24I-24Q are used to choose handset circuit status. When the lookup tables are trained, the switches are set to Training status so that two types of lookup tables 21I-21Q and 31I-31Q are updated by adaptive algorithm. When the training processing is completed, the controllers are switched to the calling status and all lookup tables in handset stop being updated.

Handset is trained by two phases. First one is to obtain and store the linearity of PA and time-delay characteristics of channels to the linearity and time-delay tables. Second one is to generate the required predistortion signals and to store them into predistortion lookup tables. The training time for two phases will take about 0.5-1 second. Preferably, the training time for two phases is less than about 4 seconds.

Figure 4:
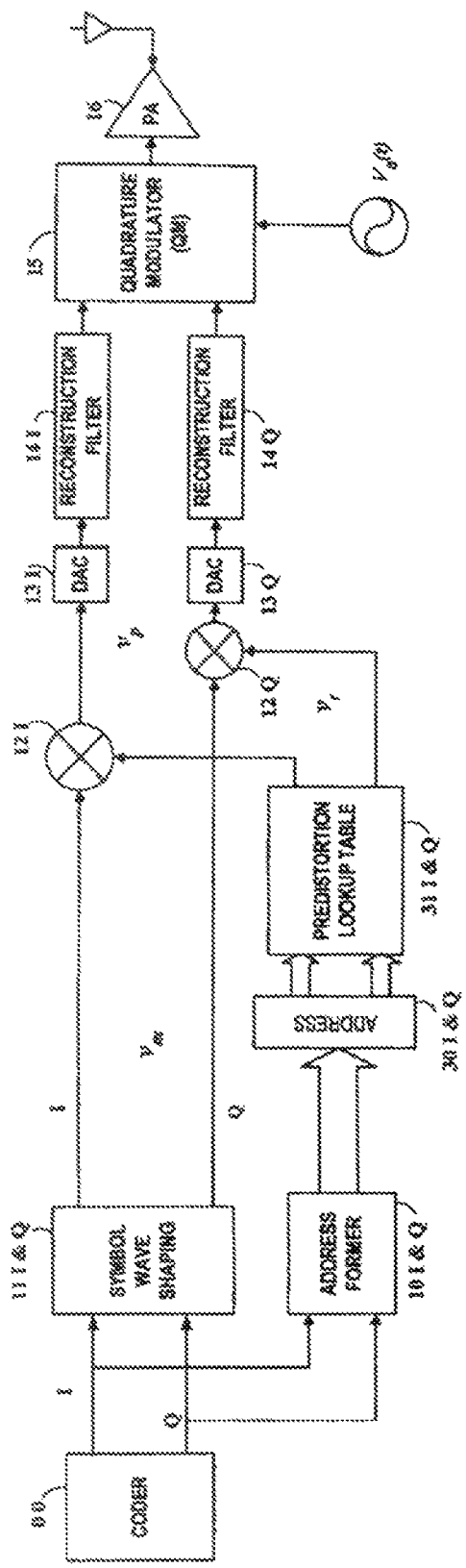
FIG. 4 shows schematically a structure of adaptive predistorter in handset when the training finished, which is an embodiment of the present invention.
Figure 5:
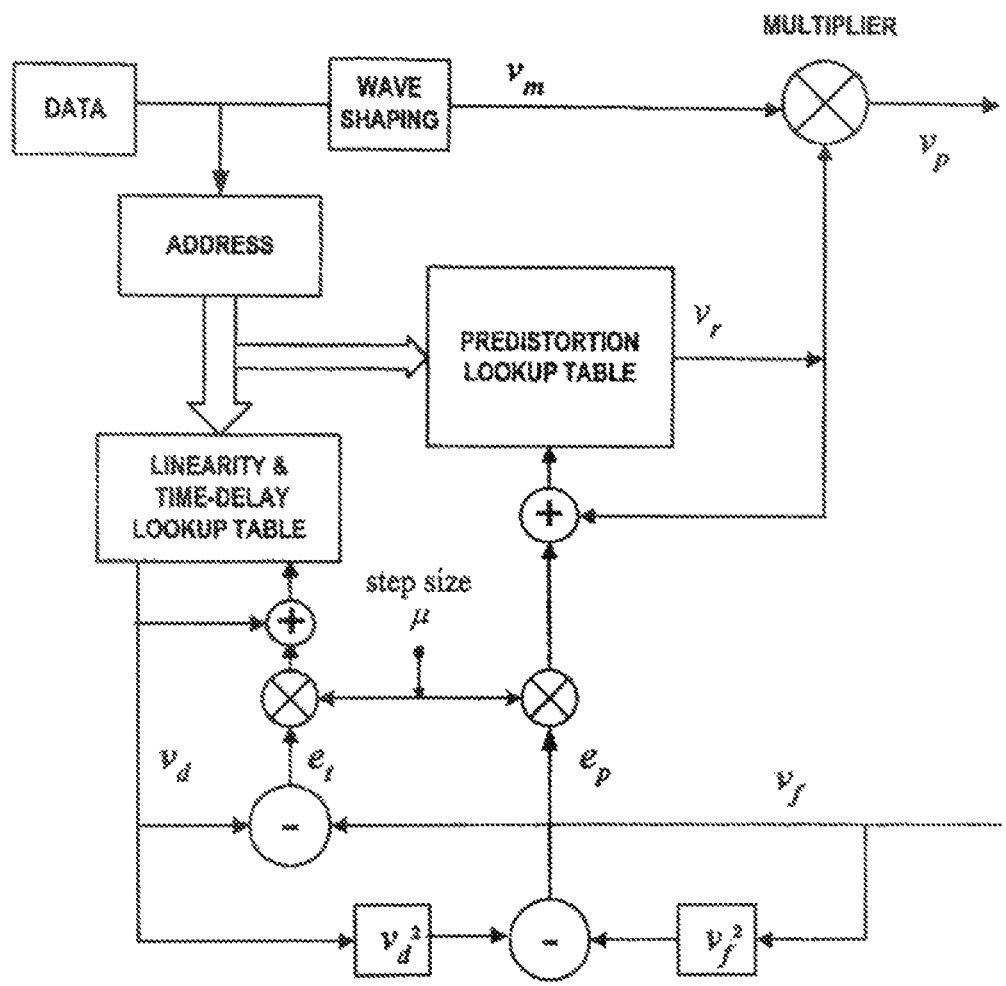
FIG. 5 shows schematically the lookup tables' arrangement in the adaptive digital predistortion scheme.

When all adaptive training finished, the handset predistortion can be implemented by the organization shown as FIG. 4. This is a very simple structure and may use the existing DSP room in handset for programming without adding any extra hardware circuit, and therefore is a cost-saving and high efficiency approach.

Predistortion Lookup Tables

The predistortion lookup tables for I- and Q-channel store the non-linearity of PA in inverse to AM-AM and AM-PM distortion to correct nonlinear distortion of RF transmitter. The predistortion lookup tables can be configured in a number of ways. However, a drawback of lookup table structure in traditional predistorter is memory less system, slow tracking speed and complicity structure, and therefore is unable to be used in handsets.

The new memorized predistorter structure presented in this patent introduces memory function into predistortion scheme by addressing operation. When the training procedure completed, the predistortion lookup tables just need to read out the signal stored in table entries according to the corresponding address for distortion correction. Thus, the predistortion of handset is completed by a simple and fast approach without great amount calculating for each correcting sampler so as to reduce of power consumption of handset.

The lookup tables of predistorter are based on a stored compensation principle that maps a set of input data into a digital output, and are updated adaptively by a time delay algorithm. The output signal of lookup table is actually related to the previous N transmitted data, and therefore has a memory function when compensate the nonlinearity of PA.

Linearity and Time-Delay Tables

The linearity and time-delay tables for I- and Q-channel are used to store the linearity of PA and time-delay characteristics of channel by adaptive training processing. In order to obtain linearity of PA, two larger sizes of lookup tables should be designed for I- and Q-channel, respectively, to obtain the linear reference signal with time-delay. The tables' outputs are compared with the feedback signals to result in the weighted error signals with nonlinear distortion for predistortion tables updating by a adaptive algorithm. After the training procedure finishes, the linearity and time-delay tables accomplish their mission.

Address of Lookup Table

The address of lookup table in predistorter is formed by the following approach. At first, the signal complex envelope of PA output can be expressed as $$v_a = v_Q G(|v_Q|^2) = H(v_p) G(|H(v_p)|^2) \quad (1)$$

where $v_Q$ is the output of quadrature modulator, $v_p$ is the predistorted signal, H is an assumed transform function from DAC to quadrature modulator, and G is a level-dependent complex gain of power amplifier. We see from predistorter architecture of FIG. 3 that the complex gain predistorter is described by the following complex gain equation $$v_p = v_m F(V_m) = v_m v_r \quad (2)$$

where F is the mapping function of lookup table, which maps a N-dimensional vector $V_m$ to real output. In fact, the N-dimensional vector represents a set of N-bit address of lookup table, expressed by $$V_m = (sg_1, sg_2, \ldots, sg_N)^T \quad (3)$$

where each binary symbol $sg_i$ in above vector can be obtained by the following expression $$sg_i = \begin{cases} 1 & v_m = 1, 1 \le i \le N \\ 0 & v_m = -1, 1 \le i \le N \end{cases} \quad (4)$$

which transforms the data from coder to the binary sign with the form of 0 or 1.

Based on mobile system architecture, the two predistortion tables are used for I and Q-channel, respectively, to map any possible combinations of input binary symbol to the lookup table output, written as $$v_{rI} = F_I(V_{mI}) \quad v_{rQ} = F_Q(V_{mQ}) \quad (5)$$

where $v_{rI} = \mathrm{Re}(v_r)$, $v_{rQ} = \mathrm{Im}(v_r)$ and $V_{mI} = \mathrm{Re}(V_m)$, $v_{mQ} \approx \mathrm{Im}(V_m)$.

Adaptive Methodology for Predistortion Lookup Table

The adaptive memorized lookup table consists of address register and memory table. The address of lookup tables are formed in a shift register by first taking binary symbol by means of Eq. (3) and (4) and then sequentially feeding the binary symbol into the shift register. The address determines the corresponding entry of lookup table that stores information related to previous N transmitted data to correct non-linearity of PA.

Assume that the address of lookup table is formed by N-bits shift register, then the lookup table contains $M = 2^N$ entries. Clearly, each output of lookup table is a function of last N transmitted data. Thus, there exist M possible estimates for PA nonlinearity at any compensation instant, and only one of them is selected as the output of lookup table by means of the address formed by N transmitted signal. The output signal is used to compensate and correct nonlinear distortion of P A.

The lookup table structure, based on the memory compensation principle, is involved only very simple logical operation and less complexity hardware structure, therefore, is better suitable to handset and higher bit rate wide band wireless communication system. We denote the address vector of table at the kth time as $$V_m(k) = (sg_1(k), sg_2(k), \ldots, sg_N(k))^T \quad (6)$$

All possible input vectors from k to previous k−M+1 time are expressed by the following set $$A = \{V_m(k), V_m(k-1), \ldots, V_m(k-M+1)\} \quad (7)$$

which records M possible estimates of PA nonlinearity, denoted by $$R(k) = (v_r(k), v_r(k-1), \ldots, v_r(k-M+1))^T \quad (8)$$

At the same time, only one of the estimates is read out from the lookup table $$v_r(k) = r_{q(k)}(k) \quad q(k) = V_m(k) \in A \in \{0,1\}^N \quad (9)$$

where the subscript $q(k) = V_m(k)$ denotes the address determined by N input binary symbol characters at kth time. Thus, the mapping function F of lookup table can be written by $$F(V_m(k)) = r_{q(k)}(k) \quad V_m(k) \in \{0,1\}^N, r \in R \quad (10)$$

Note that F is unknown and hardly expressed mathematically before adaptive procedure beginning. However, F may be determined adaptively by updating lookup table entries under the adaptive algorithm to realize all possible mapping that corresponds to the relations with $\{0,1\}^N \to R$.

The entries of lookup table can be updated by the following iteration $$r_1(k+1) = \begin{cases} r_i(k) & 1 \le i \le M, i \ne q(k) \\ r_i(k) + \mu e_p(k) & i = q(k) \end{cases} \quad (11)$$

where $e_p(k)$ is the error signal, and $\mu$ is the step size ranged from $0<\mu<1$ to control the convergence rate and steady-state of algorithm.

The error signal $e_p(k)$ contains both AM-AM and AM-PM components of PA so that the memorized predistorter could track adaptively variation of amplitude and phase characteristics of PA. The envelope error using to update lookup table entries is given by $$e_p(k) = v_d^2(k) - v_f^2(k) \quad (12)$$

where $v_j^2(k)$ and $v_d^2(k)$ express the envelopes of feedback signal $v_f(k)$ and reference signal $v_d(k)$ respectively.

Adaptive Updating of Linearity and Time-Delay Lookup Table

The adaptive training for linearity and time-delay table is based on the traditional MSE updating algorithm. The entries of lookup table are updated by the following iteration $$r_1(k+1) = \begin{cases} r_i(k) & 1 \le i \le M, i \ne q(k) \\ r_i(k) + \mu e_i(k) & i = q(k) \end{cases} \quad (13)$$

where the error signal $e_i(k)$ is given by $$e_i(k) v_d(k) - v_f(k) \quad (14)$$

where $v_f(k)$ and $v_d(k)$ express the feedback signal with linear characteristic and reference signal that is the output of table, respectively.

(Other) Observations

Embodiments of the present invention may be adapted for use for all wireless systems regardless the modulation types (such as QAM, QPSK, OFDM and others) and PA models used in wireless systems including variety of mobile stations, handsets, base stations and access points such as, for example:

Current wireless system: CDMA, TDMA, GSM, GPRS and their extension systems;

Next generation broadband wireless system: CDMA2000, UMTS, WCDMA, 3GPP, WLAN (802.11 a, b specifications) and their extension systems;

PDA and potable mobile PC for WLAN (802.11 a, b) system and their extension systems.

In an embodiment, an arrangement of lookup table address introduces a stored compensation function into predistorter. As the result, the predistorter is of memory function when it estimates and corrects nonlinear distortion of RF transmitter, which is extremely effective to provide a dynamic predistortion correction of AM-AM and AM-PM distortion in wider range.

In an embodiment, an arrangement the stored compensation function depends on the address data in lookup table. Therefore, each predistortion output of lookup table is not only related to the current input data but also related to last N transmitted data. Actually, the output of predistorter is a function of last N transmitted symbol.

In an embodiment, the predistortion correction for AM-AM and AM-PM distortion can be implemented by a measure of vector multiplication between the outputs of lookup tables and the output shaping filters. Also, other approach such as vector adding can be used to implement the predistortion correction. Because all entries of lookup table are adaptively updated by a weighted envelope error that contains both AM-AM and AM-PM characteristics of PA, the outputs of lookup tables contain the inverse AM-AM and AM-PM distortion components.

In an embodiment, the predistorter uses two types of lookup tables for different roles in handset predistortion. One is the predistortion table to provide predistortion signal for the non-linearity correction of PA. Another is the linearity and time-delay table to store the linearity of PA and time-delay characteristics of channel, which will be used as reference signal for the training of predistortion table.

In an embodiment, the linearity of PA and time-delay characteristics of channel are obtained by adaptive training. After the algorithm converges, the memorized information in the table is the reference signal required by predistortion table. Because the reference signal also contains the time-delay characteristics of channel of handset, there is no necessary to build a special time-delay circuit for estimating the time-delay of channel for the power consumption saving in handset.

In an embodiment, the linearity and time-delay table is trained by adaptive algorithm when PA of handset is set in the linear region so that the linear characteristics of PA could be pick up and stored into the entries of table. After algorithm converges, the required linear and time-delay characteristics of handset are stored in the table, and PA is set back to its non-linear operating region working as Class C or D amplifier.

In an embodiment, the linearity and time-delay table will be trained first to obtain the linear and time-delay characteristics of handset. Then predistortion table is trained by the reference signal from linearity and time-delay table to obtain the required predistortion signal and be stored in predistortion table for nonlinear distortion correction.

In an embodiment, the training for both linearity table and the predistortion table ill take around 0.5 to 1 second. Afterward, the linearity and time-delay table accomplished its mission and becomes static table without any output and being updated. Also the predistortion table is no longer updated by adaptive algorithm, and only responds to the input data in address register to output the corresponding predistortion signal. Thus, in an embodiment, the lookup tables in the predistorter will not be longer be updated after the training. For example, they will not be updated for at least one telephone call. For example, they will not be updated for at least one day of use. An actual handset predistortion structure is very simple and may use the existing DSP chip in handset for all predistortion signal processing.

Throughout the description and drawings, example embodiments are given with reference to specific configurations. It will be appreciated by those of ordinary skill in the art that the present invention can be embodied in other specific forms. Those of ordinary skill in the art would be able to practice such other embodiments without undue experimentation. The scope of the present invention, for the purpose of the present patent document, is not limited merely to the specific example embodiments of the foregoing description, but rather is indicated by the appended claims. All changes that come within the meaning and range of equivalents within the claims are intended to be considered as being embraced within the spirit and scope of the claims.

What is claimed is:

1. A power amplifier system comprising:
an input operable to receive an input signal that reflects information to be communicated;
an address data former operable to generate a digital lookup table key based on the input signal;
a predistortion lookup table coupled to the address data former;
a time-delay memory table coupled to the address data former, the time-delay memory table storing one or more of information representing a linearity of a power amplifier and/or time-delay characteristics of channels;
the power amplifier having an output and coupled to the predistortion lookup table;
a feedback loop operable to provide a feedback signal associated with the output of the power amplifier to the predistortion lookup table, wherein the feedback signal is used to update the predistortion lookup table; and
a switch disposed in the feedback loop and operable to couple the output of the power amplifier and the predistortion lookup table during a training procedure and to decouple the output of the power amplifier from the predistortion lookup table after the training procedure has completed.

2. The power amplifier system of claim 1, wherein the power amplifier system is a component of a mobile device.

3. The power amplifier system of claim 1, wherein the power amplifier system is a component of a base station.

4. The power amplifier system of claim 1, wherein the power amplifier system further comprises an I-Q address register coupling the time-delay memory table and the address data former.

5. The power amplifier system of claim 4, wherein the feedback signal and an output signal of the time-delay memory table are used to update the predistortion lookup table.

6. The power amplifier system of claim 5, wherein the switch is operable to couple an output of the time-delay memory table and the predistortion lookup table during the training procedure and to decouple the output of the time-delay memory table from the predistortion lookup table after the training procedure has completed.

7. The power amplifier system of claim 1, further comprising an antenna coupled to the output of the power amplifier.

8. The power amplifier system of claim 1, further comprising a switch controller operable to control the switch.

9. The power amplifier system of claim 1, wherein a duration of the training procedure is less than 4 seconds.

10. The power amplifier system of claim 1, wherein the input signal includes in-phase and quadrature components.

11. A method to operate a power amplifier system having a power amplifier, the method comprising:
receiving, at an input of the power amplifier system, an input signal that reflects information to be communicated;
generating, by an address data former, a digital lookup table key based on the input signal, the digital lookup table key being supplied to a predistortion lookup table and a time-delay memory table, the time-delay memory table storing one or more of information representing a linearity of a power amplifier and/or time-delay characteristics of channels;
generating, by the predistortion lookup table, a predistortion output based on the digital lookup table key;
generating, at an output of the power amplifier, an amplified signal based on the input signal and the predistortion output;
providing, by a feedback loop, a feedback signal associated with the amplified signal to the predistortion lookup table;
during a training procedure, coupling, by a switch disposed in the feedback loop, the output of the power amplifier and the predistortion lookup table; and
after completion of the training procedure, decoupling, by the switch, the output of the power amplifier from the predistortion lookup table.

12. The method of claim 11, wherein the power amplifier is a component of a mobile device.

13. The method of claim 11, wherein the power amplifier is a component of a base station.

14. The method of claim 11, further comprising supplying, from the address data former and via an I-Q address register, the time-delay memory table the digital lookup table key.

15. The method of claim 14, wherein the feedback signal and an output signal of the time-delay memory table are used to update the predistortion lookup table.

16. The method of claim 15, wherein the switch is operable to couple an output of the time-delay memory table and the predistortion lookup table during the training procedure and to decouple the output of the time-delay memory table from the predistortion lookup table after the training procedure has completed.

17. The method of claim 11, wherein an antenna is coupled to the output of the power amplifier.

18. The method of claim 11, wherein a switch controller is operable to control the switch.

19. The method of claim 11, wherein a duration of the training procedure is less than 4 seconds.

20. The method of claim 11, wherein the input signal includes in-phase and quadrature components.

* * * * *